United States Patent
Carpineto et al.

(10) Patent No.: US 7,081,791 B2
(45) Date of Patent: Jul. 25, 2006

(54) AUTOMATICALLY ADJUSTING LOW NOISE AMPLIFIER

(75) Inventors: Lorenzo M. Carpineto, Antibes (FR); Eric Duvivier, Golfe Juan (FR); Stefano Cipriani, Golfe Juan (FR)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 10/820,675

(22) Filed: Apr. 7, 2004

(65) Prior Publication Data

US 2005/0073357 A1  Apr. 7, 2005

(30) Foreign Application Priority Data

Oct. 7, 2003  (EP) .................................. 03292472

(51) Int. Cl.
*H03G 3/20* (2006.01)
(52) U.S. Cl. ........................................................ 330/2
(58) Field of Classification Search ................... 330/2, 330/129, 136
See application file for complete search history.

(56) References Cited

U.S. PATENT DOCUMENTS

| 5,426,641 | A | 6/1995 | Afrashteh et al. |
| 5,861,774 | A * | 1/1999 | Blumenthal ..................... 330/2 |
| 6,175,279 | B1 | 1/2001 | Ciccarelli et al. |
| 2002/0070808 | A1 | 6/2002 | Tichauer |
| 2003/0073419 | A1 | 4/2003 | Chadwick |

* cited by examiner

*Primary Examiner*—Steven J. Mottola
(74) *Attorney, Agent, or Firm*—Ronald O. Neerings; Wade James Brady, III; Frederick J. Telecky, Jr.

(57) ABSTRACT

A low noise amplifier circuit (10) includes an attenuator (12) for receiving a calibration signal and generating an attenuated calibration signal. A low noise amplifier (14) amplifies the attenuated calibration signal in calibration mode or amplifies a functional signal in functional mode. In calibration mode, a envelope detector/comparator (16) compares the calibration signal with the output of the low noise amplifier and generates a compensation signal indicating a deviation between the two signals. The gain of the low noise amplifier is adjusted responsive to the compensation signal.

10 Claims, 4 Drawing Sheets

AUTOMATICALLY ADJUSTING LOW NOISE AMPLIFIER

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to an automatically adjusting low noise amplifier.

2. Description of the Related Art

LNAs (Low Noise Amplifiers) are used in a number of fields, particularly in communication and networking devices. An LNA provides a steady gain over a specified frequency bandwidth. One common application is the use of a LNA as the input stage of a receiving circuit, such as in a mobile communication device.

In many applications, it is necessary for the LNA to provide a precise gain. With deep submicron semiconductor processes used for digital circuits, producing a precise gain can be problematic. An LNA could be adjusted manually by controlling current through the LNA via fusible current paths, but the cost of manually adjusting each device by individually enabling current paths to set the LNA to a specific gain would significantly increase the cost of a device.

Therefore, a need has arisen for an automatically adjusting LNA.

BRIEF SUMMARY OF THE INVENTION

In the present invention, a low noise amplifier circuit comprises an attenuator for receiving a calibration signal and generating an attenuated calibration signal and a low noise amplifier for amplifying the attenuated calibration signal in calibration mode or amplifying a functional signal in functional mode. A comparator compares the calibration signal with the output of the low noise amplifier in calibration mode and generates a compensation signal indicating a deviation between the actual gain of the low noise amplifier and a desired gain. The gain of the low noise amplifier is adjusted responsive to the compensation signal.

The present invention provides significant advantages over the prior art. First, the low noise amplifier is automatically adjusted to the proper gain. Second, the low noise amplifier can be adjusted responsive to events (such as a change in operating frequency or temperature) or periodically to maintain an accurate gain.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1 through 5a–b of the drawings, like numerals being used for like elements of the various drawings.

Figure 1:
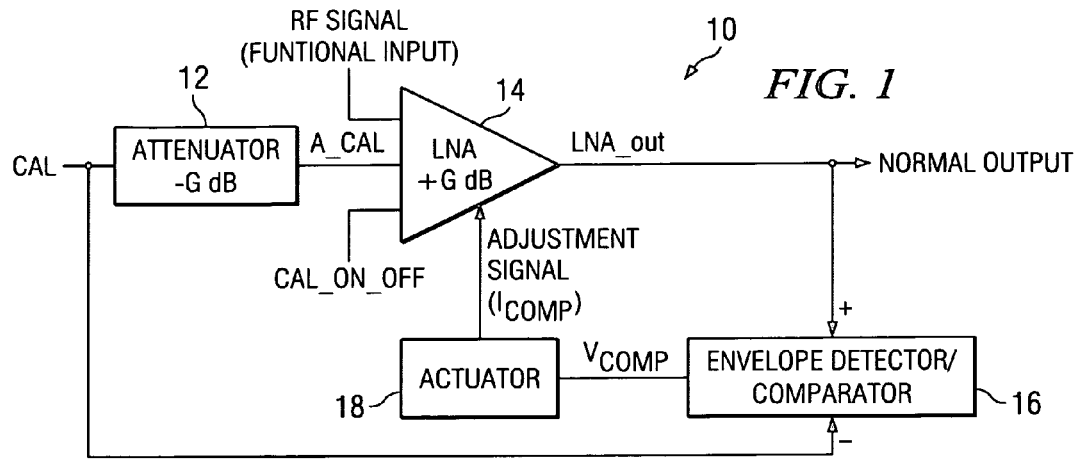
FIG. 1 illustrates a block diagram of an automatically adjusting LNA circuit.

FIG. 1 illustrates a block diagram of an automatically adjusting LNA circuit 10. A calibration signal (CAL) is input to an attenuator 12, which precisely attenuates the signal by a desired factor (−G dB). The output of the attenuator 12 is input to an adjustable LNA 14, along with the RF signal amplified by the LNA 14 during normal operations and a calibration control signal (CAL_ON_OFF), which switches the LNA between calibration mode (CAL_ON_OFF=1) and normal operating mode (CAL_ON_OFF=0). Ideally, the gain of LNA 14 is +G dB. The output of the LNA 14 (LNA_out) is coupled to an envelope detector/comparator circuit 16, along with the calibration signal. The envelope detector/comparator circuit 16 generates an error signal, $V_{comp}$, that indicates the difference between the envelopes of the LNA output and the original calibration signal. The actuator 18 varies a biasing signal ($I_{comp}$) to adjust the gain of the LNA responsive to Vcomp.

In calibration mode, the attenuator 14 attenuates the calibration signal by −G db and the LNA amplifies the output of the attenuator with a specified gain of +G dB; hence, if the LNA is accurate, the amplitude of the output of the LNA 14 will be the same as the amplitude of the calibration signal. In this case, the output of the envelope detector/comparator 16 will be zero. If the amplification of the LNA 14 is slightly less than G dB, then the amplitude of the output of the LNA 14 will be slightly less than the amplitude of the calibration signal and the output of the envelope detector/comparator 16 will be a negative voltage. On the other hand, if the amplification of the LNA 14 is slightly more than G dB, then the amplitude of the output of the LNA 14 will be slightly more than the amplitude of the calibration signal and the output of the envelope detector/comparator 16 will be a positive voltage.

The envelope detector/comparator 16 rectifies the calibration signal (CAL) and the output of the LNA (LNA_out) and compares these envelopes. The output ($V_{comp}$) of the envelope detector/comparator 16 is a signal that indicates the polarity and magnitude of the amplitude deviation between the LNA_out and CAL. Thus, with an accurate attenuator 12, the output of the envelope detector/comparator 16 accurately indicates the deviation between the actual gain of LNA 14 with respect to the specified gain (G dB) of the LNA 14.

The actuator 18 generates an adjustment signal ($I_{comp}$) that adjusts the gain of LNA 14 in accordance with $V_{comp}$. Once set, $I_{comp}$ remains constant even after the LNA 14 is taken out of calibration mode. Accordingly, $I_{comp}$ correctly sets the gain of LNA 14 to its specified gain setting during normal (functional) operation.

Figure 2:
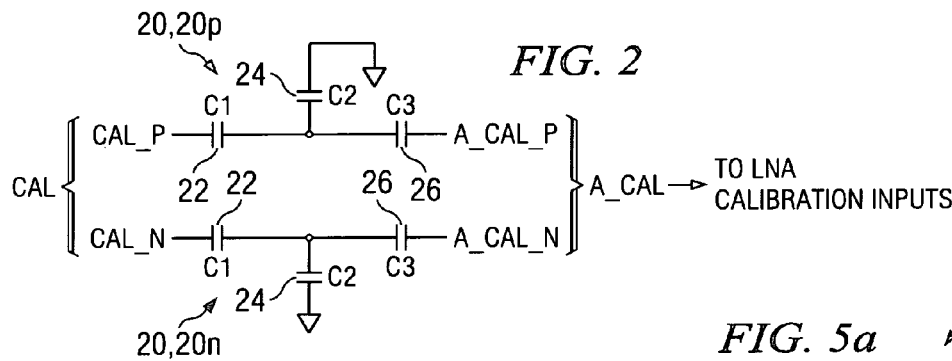
FIG. 2 illustrates a schematic representation of a precision attenuator.

FIGS. 2 through 5a–b illustrate more detailed schematics of the major function blocks of FIG. 1 for a differential LNA 14. As would be known to one skilled in the art, similar concepts could be used for a single-ended LNA. FIG. 2 illustrates a schematic representation of a precision attenuator 12. The differential calibration signal, CAL, is defined by CAL_P and CAL_N, the positive and negative poles of the signal respectively. CAL_P and CAL_N are each input to a respective capacitor divider circuit 20, individually referenced as 20p and 20n. The outputs of the capacitor divider circuits are the attenuated differential signals, A_CAL_P and A_CAL_N.

Each divider circuit comprises first and second capacitors 22 and 24 in series between the input of the attenuator and ground, with a third capacitor 26 coupled between the node connecting capacitors 22 and 24 and the output. With capacitors 22 having a value C1, capacitors 24 having a value C2 and capacitors 26 having a value C3, the capacitor values are set such that G=20 log(C2/C1), where G is the specified gain of the LNA 14 in decibels. For a 20 dB LNA gain, therefore, C1 could be set to 100 fF and C2 set to 1 pF. C3 is not critical, but should be set to a value similar to the input capacitor at the functional inputs of the LNA 14 (see capacitors 60 and 61 in FIGS. 3a and 3b).

Figure 3A:
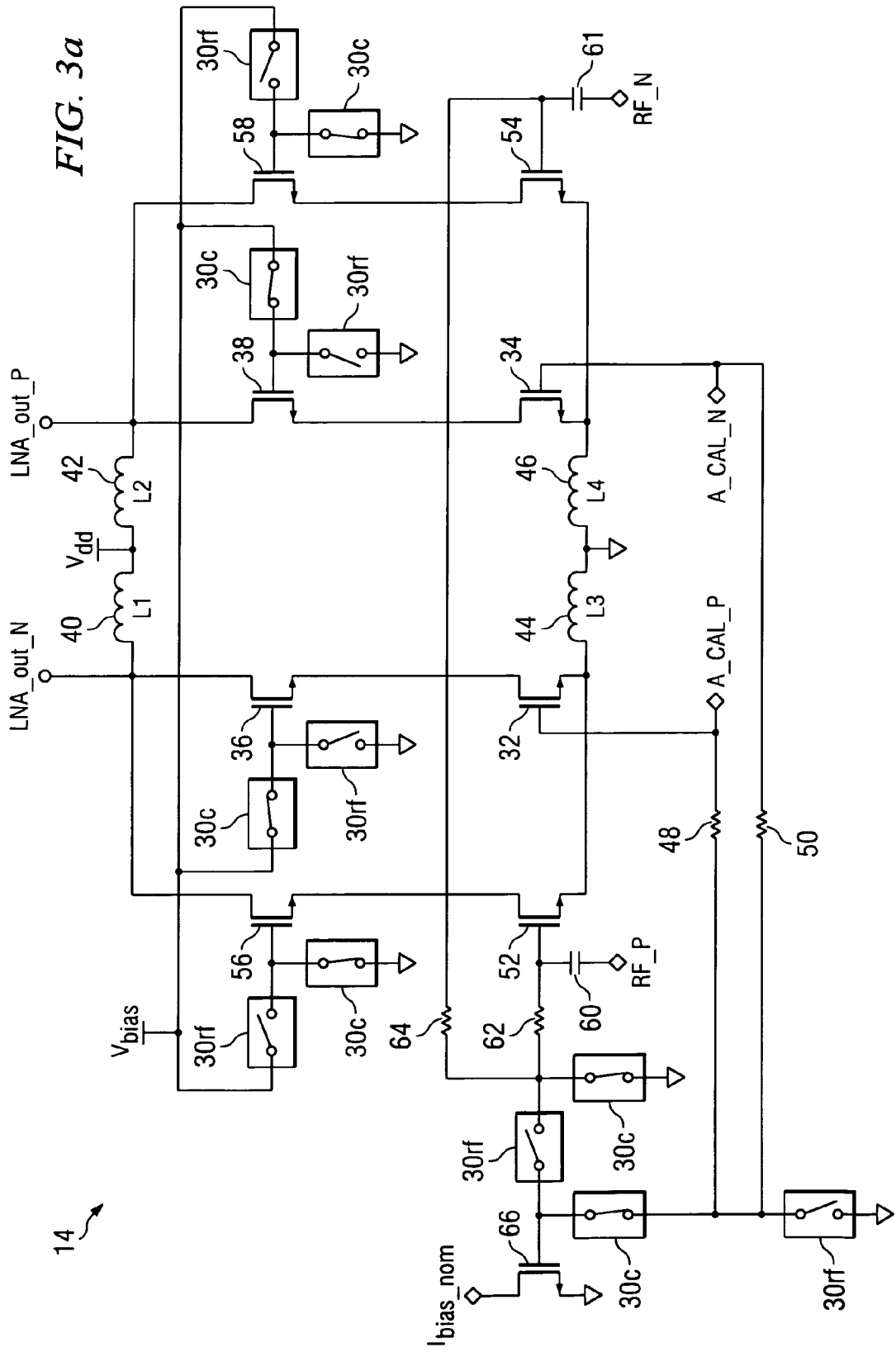
FIGS. 3a and 3b illustrate schematics of a LNA in calibration mode and functional mode, respectively.
Figure 3B:
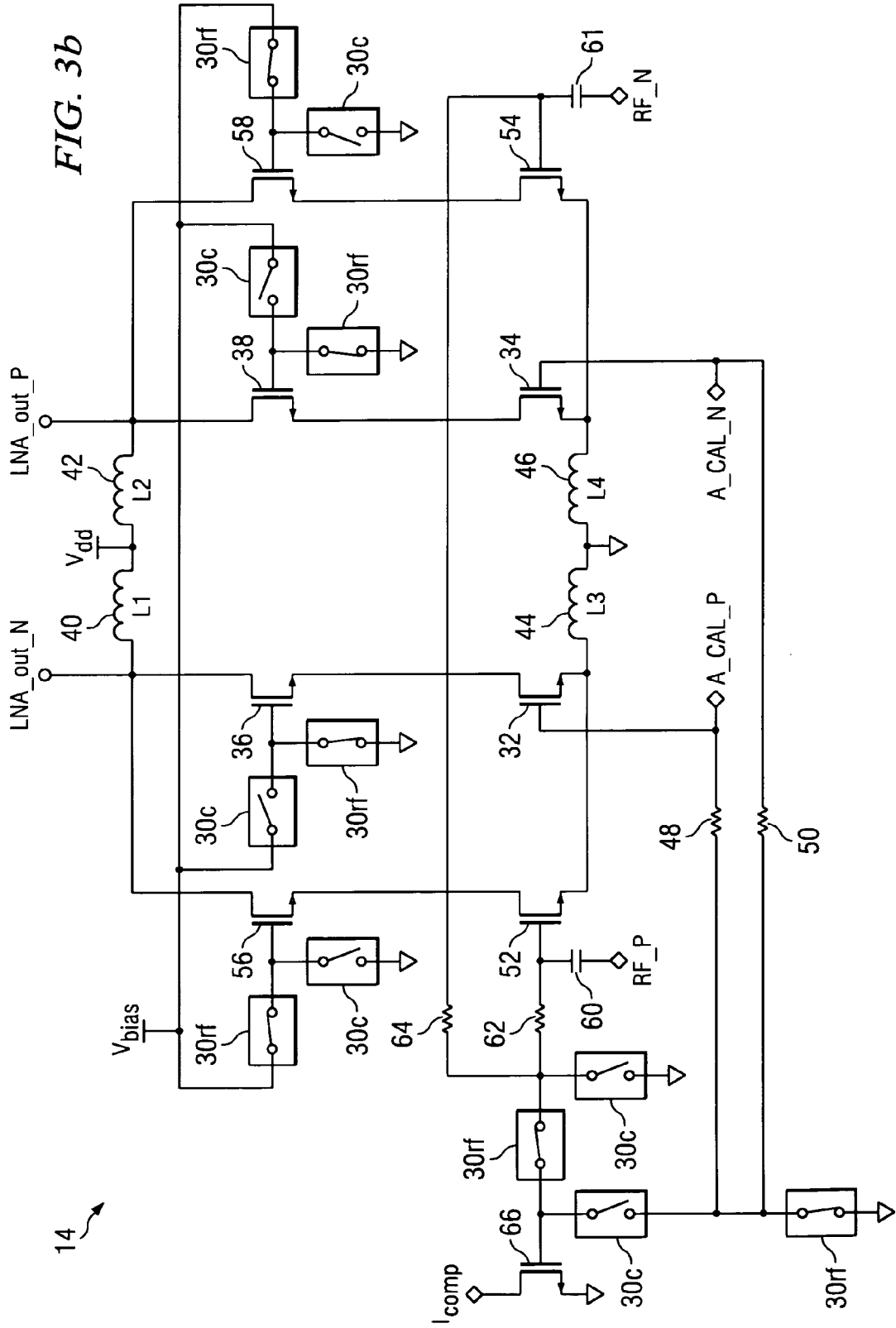

FIGS. 3a and 3b illustrate schematics of a LNA 14 in calibration mode and functional mode, respectively. As described in connection with FIG. 1, control signal CAL_ON_OFF controls whether the LNA 14 is in calibration mode or in functional mode. When CAL_ON_OFF is in a first state (e.g., a logical high state), switches 30c are closed (i.e., in a low impedance state) and switches 30rf are open (e.g., in a high impedance state), as shown in FIG. 3a. Likewise, when CAL_ON_OFF is in a second state (e.g., a logical low state), switches 30c are open and switches 30rf are closed, as shown in FIG. 3b.

In FIG. 3a (calibration mode) the attenuated calibration inputs A_CAL_P and A_CAL_N are coupled to the gates of n-channel transistors 32 and 34, respectively. In this mode, the gain applied to A_CAL_P and A_CAL_N is caused by inductors 40 and 42 (which are center tap to $V_{dd}$) and transistors 32, 34, 36 and 38. Transistors 36 and 38 are always enabled in calibration mode, since they are biased by $V_{bias}$. Inductors 44 and 46 improve the linearity of the signal.

In calibration mode, transistors 52, 54, 56 and 58 are isolated from the operation of the circuit by open switches 30rf.

In operation, transistors 32 and 34 are partially biased by the voltage generated at the gate of transistor 66 by $I_{bias\_nom}$ (the nominal bias current for the LNA 14), through high impedance resistors 48 and 50, respectively. The attenuated differential signals A_CAL_P and A_CAL_N drive resistors 48 and 50 to produce the output voltages LNA_out_N and LNA_out_P.

In functional mode (normal receiving mode) of FIG. 3b, transistors 32, 34, 36 and 38 are isolated from the operation of the LNA 14 by switches 30c and transistors 52, 54, 56 and 58 perform the amplification of the RF differential signals RF_P and RF_N. Transistors 56 and 58 are biased by $V_{bias}$, through switches 30rf. Transistors 52 and 54 are partially biased by the voltage at the gate of transistor 66, caused by $I_{comp}$ (if $V_{comp}=0$, then $I_{comp}=I_{bias\_nom}$). The RF_P and RF_N signals drive transistors 52 and 54, respectively, to pass current from inductors 40 and 42, thereby creating amplified differential voltages LNA_out_P and LNA_out_N.

Because corresponding transistor pairs 32 and 52, 36 and 56, 38 and 58, and 34 and 54 are fabricated proximate to one another, the gain from the LNA 14 in calibration mode should be identical to the gain in functional mode. The only difference will be the signal amplified by the LNA 14. Consequently, by amplifying the attenuated calibration signal in the LNA 14 in calibration mode, and comparing the output of the LNA with the original calibration signal, any deviation from nominal gain can be detected. A deviation between the actual and specified gain for the LNA 14 can be corrected by adjusting $I_{comp}$.

Figure 4:
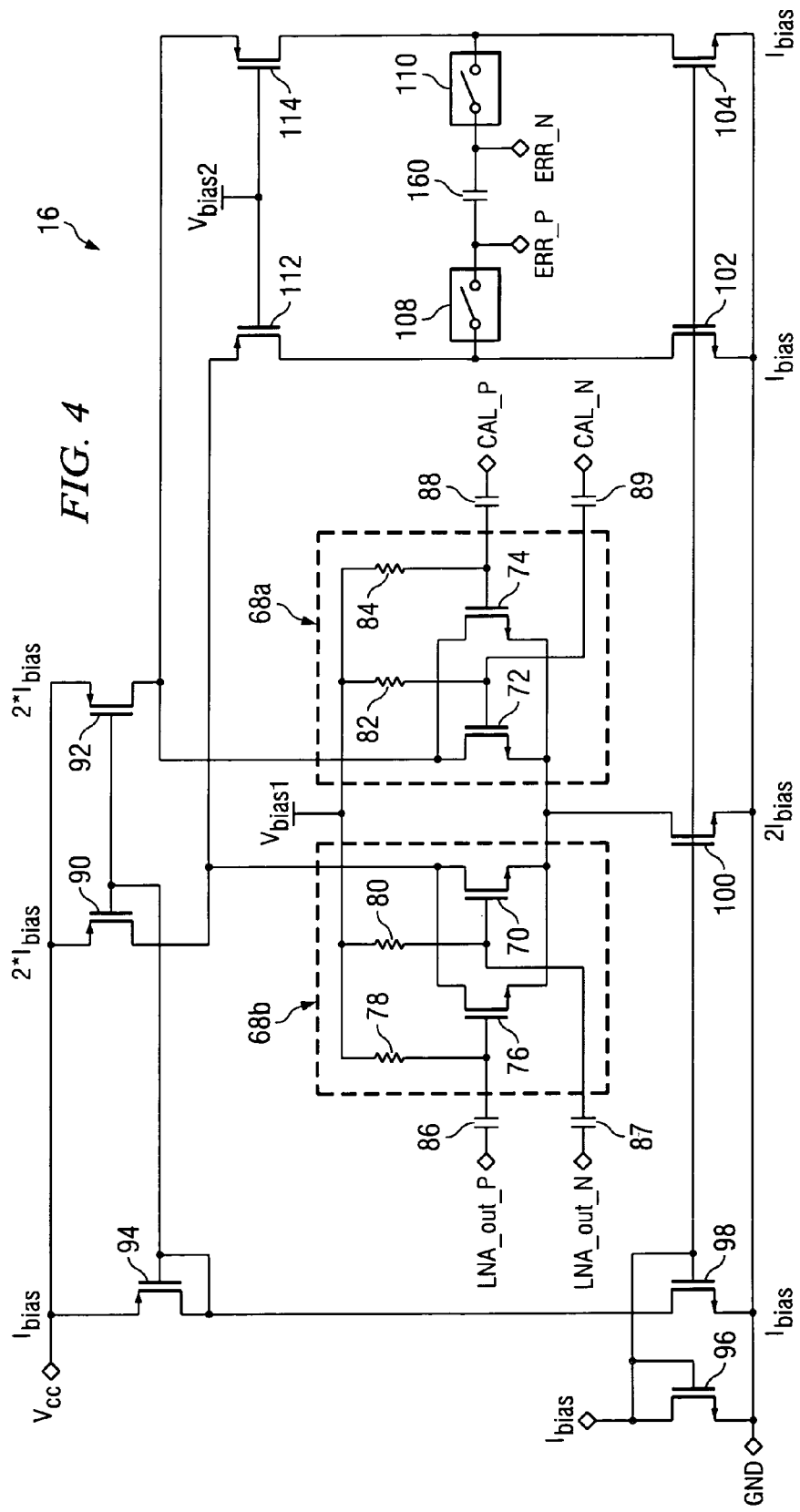
FIG. 4 illustrates a schematic of a envelope detector/comparator.

FIG. 4 illustrates a schematic of a envelope detector/comparator 16. The calibration signals, CAL_P and CAL_N are received by a first rectifier 68a and the outputs of the LNA 14 are received by a second rectifier 68b. Rectifier 68a includes n-channel transistor 72, n-channel transistor 74, resistor 82 and resistor 84, where the gate of transistor 72 is coupled to CAL_N, through input capacitor 89 and transistor 74 is coupled to CAL_P through input capacitor 88. Resistors 82 and 84 couple the gates of transistors 72 and 74, respectively, to $V_{bias1}$. Similarly, for rectifier 68b, the gates of transistors 70 and 76 are coupled to LNA_out_N and LNA_out_P, through capacitors 87 and 86, respectively. Resistors 80 and 78 couple the gates of transistors 70 and 76, respectively, to $V_{bias1}$.

P-channel transistors 90 and 92 have first source/drains coupled to $V_{cc}$ and second source/drains coupled to first source/drains of transistors 70 and 72, respectively. P-channel transistor 94 has a first source/drain coupled to $V_{cc}$ and a second source/drain coupled to the gates of transistors 90, 92 and 94 and to a first source/drain of n-channel transistor 98. Transistor 98 has a second source/drain coupled to ground. N-channel transistor 96 has a first source/drain coupled to current source $I_{bias}$ and a second source/drain coupled to ground. The gates of n-channel transistors 96, 98, 100, 102 and 104 are coupled to current source $I_{bias}$. Second source/drains of transistors 70, 72, 74 and 76 are coupled to a first source drain of transistor 100. The second source/drain of transistor 100 is coupled to ground.

First source/drains of transistors 90 and 92 are also coupled to first source/drains of p-channel transistors 112 and 114, respectively. The gates of transistors 112 and 114 are coupled to $V_{bias2}$. The second source/drain of transistor 112 is coupled to the first source/drain of transistor 102 and to a first terminal of capacitor 106, through switch 108. The second source/drain of transistor 114 is coupled to the first source/drain of transistor 104 and to a second terminal of capacitor 106, through switch 110. The second source/drains of transistors 102 and 104 are coupled to ground. The error signal $V_{comp}$ is defined as the voltage across the capacitor 106 (i.e., the voltage between ERR_P and ERR_N).

In operation, the envelope detector/comparator 16 turns the voltages of the incoming calibration signals, CAL_P and CAL_N, and the outputs of the LNA, LNA_out_P and LNA_out_N, into two signal currents, which are compared by transistors 90 and 92. An imbalance in the amplitude of the CAL and LNA_out signals will cause one of the transistors 90 or 92 to turn on harder than the other, creating a signal current across capacitor 106. The integration of the signal across capacitor 106 produces a differential error voltage. Switches 108 and 110 are closed during calibration mode to allow any voltage across capacitor 106 to charge the capacitor. At the end of calibration mode, the voltage across capacitor 106 defines the deviation of the gain of the LNA 14 from its specified value. If the voltage across the capacitor is 0 volts, then the gain of the LNA is correct and $I_{comp}=I_{bias\_nom}$, where $I_{bias\_nom}$ is the nominal bias current of the LNA 14. Otherwise, the voltage across capacitor 106 is used to vary $I_{comp}$. In the preferred embodiment, $0<I_{comp}<I_{biasnom}*2$.

Figure 5A:
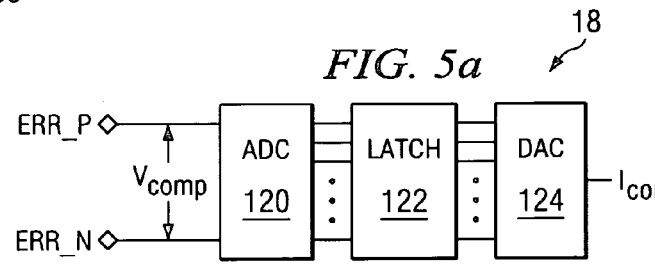
FIG. 5a illustrates an example of a digital implementation of an actuator.

FIG. 5a illustrates an example of a digital implementation of actuator 18. In this embodiment, the ERR_P and ERR_N are input to an analog-to-digital converter 120, which converts the voltage across capacitor 106 of the envelope detector/comparator 16 into a digital representation. This value is stored in latch 122. The value in latch 122 is used to generate $I_{comp}$ in digital-to-analog converter 124. Once the value is stored in latch 122, the value of the voltage across capacitor 106 may vary without affect on $I_{comp}$.

Figure 5B:
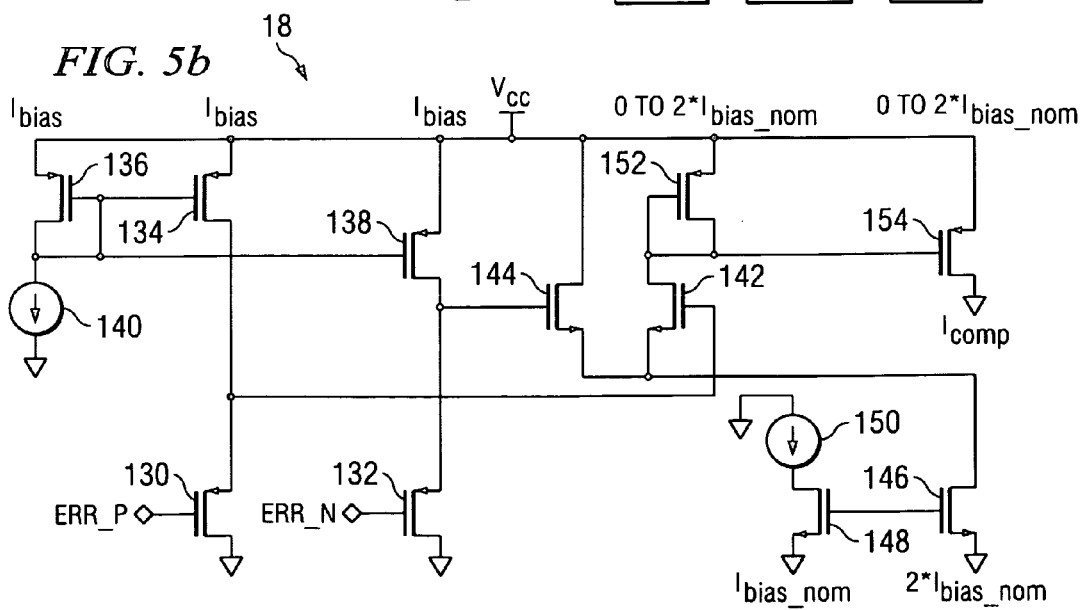
FIG. 5b illustrates an example of an analog implementation of an actuator.

FIG. 5b illustrates an example of an analog implementation of actuator 18. ERR_P is coupled to the gate of p-channel transistor 130 and ERR_N is coupled to the gate of p-channel transistor 132. A first source/drain of transistor 130 is coupled to a first source/drain of p-channel transistor 134. A second source/drain of p-channel transistor 134 is coupled to $V_{cc}$. The gate of transistor 134 is coupled to the gate of p-channel transistor 136 and the gate of p-channel transistor 138. The gates of transistors 134, 136 and 138 are coupled to a current source 140 and a first source/drain of transistor 136. A first source/drain of transistor 138 is coupled to a first source/drain of transistor 132. The second source/drains of transistors 134, 136 and 138 are coupled to $V_{bias}$. The first source/drain of transistor 130 is coupled to the gate of n-channel transistor 142 and the first source/drain of transistor 132 is coupled to the gate of n-channel transistor 144. First source/drains of transistors 142 and 144 are coupled to a first source/drain of n-channel transistor 146. The gate of transistor 146 is coupled to the gate of n-channel transistor 148. A first source/drain of transistor 148 is coupled to a current source 150. The second source/drain of transistor 144 is coupled to $V_{bias}$. The second source/drain of transistor 142 is coupled to a gate and first source/drain of p-channel transistor 152 and to the gate of p-channel transistor 154. Second source/drains of transistors 152 and 154 are coupled to $V_{bias}$. Second source/drains of transistors 130, 132, 146 and 148 are coupled to ground.

In operation, the analog actuator of FIG. 5b receives the ERR_P and ERR_N voltages from envelope detector/comparator 16. If these signals are the same (i.e., zero volts across capacitor 106), the voltages driving transistors 142 and 144 will also be the same, and the current through transistors 142 and 144 will be set to $I_{bias\_nom}$. Accordingly, $I_{comp}$ will be set to $I_{bias\_nom}$ through the current mirror formed by transistors 152 and 154. If ERR_P and ERR_N are not equal (i.e., there is a positive or negative voltage across capacitor 106), one of the transistors 142 or 144 will be driven harder than the other, causing the current through one of the transistors to be higher than the other. Accordingly, $I_{comp}$ can range from between zero and $2*I_{bias\_nom}$.

An advantage of the digital actuator 18 shown in FIG. 5a is that the calibrated word is stored indefinitely, so calibration need only be performed when a gain change is expected (for example, with a change in temperature or frequency, or periodically to account for aging). The analog circuit of FIG. 5b has the advantage that its accuracy would be limited only by the noise of the system. On the other hand, the voltage across the capacitor will degrade over time, so calibration needs to be repeated before receiving a burst.

The present invention provides significant advantages over the prior art. First, the low noise amplifier is automatically adjusted to the proper gain. Second, the low noise amplifier can be adjusted responsive to events (such as a change in operating frequency or temperature) or periodically to maintain an accurate gain.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

The invention claimed is:

1. A low noise amplifier circuit comprising:
    an attenuator for receiving a calibration signal and generating an attenuated calibration signal;
    a low noise amplifier for amplifying the attenuated calibration signal in calibration mode or a functional signal in functional mode;
    a comparator for comparing the calibration signal with the output of the low noise amplifier in calibration mode and generating a compensation signal indicating a deviation between the actual gain of the low noise amplifier and a desired gain; and
    circuitry for adjusting the gain of the low noise amplifier responsive to the compensation signal.

2. The low noise amplifier circuit of claim 1 wherein the attenuator attenuates the calibration signal by −G dB, where G dB is the desired gain of the low noise amplifier.

3. The low noise amplifier circuit of claim 1 wherein said circuitry for adjusting the gain comprises circuitry for modifying a biasing current of the low noise amplifier circuit responsive to the compensation signal.

4. The low noise amplifier circuit of claim 3 wherein said circuitry for adjusting the gain comprises circuitry for generating the compensating current responsive to the voltage of the compensation signal.

5. The low noise amplifier circuit of claim 1 wherein said low noise amplifier has a first current path coupled to the output of the attenuator and a second current path coupled to the functional signal.

6. A method of controlling the gain of a low noise amplifier circuit comprising:
    attenuating a calibration signal to produce an attenuated calibration signal;
    amplifying the attenuated calibration signal with the low noise amplifier to produce a reference signal;
    comparing the calibration signal with the reference signal and generating a compensation signal responsive to the comparison, indicating a deviation between the actual gain of the low noise amplifier and a desired gain; and
    adjusting the gain of the low noise amplifier responsive to the compensation signal.

7. The method of claim 6 wherein the attenuating step comprises the step of attenuating the calibration signal by G dB, where G dB is the desired gain of the low noise amplifier.

8. The method of claim 6 wherein the adjusting step comprises the step of modifying a biasing current of the low noise amplifier circuit responsive to the compensation signal.

9. The method of claim 8 wherein the adjusting step comprises the step of generating the biasing current responsive to the voltage of the compensation signal.

10. The method of claim 6 and further comprising the step of repeating the attenuating, amplifying, comparing and adjusting steps during operation of the low noise amplifier.

* * * * *